(12) United States Patent
Kolis

(10) Patent No.: US 7,374,616 B2
(45) Date of Patent: May 20, 2008

(54) ACENTRIC LITHIUM BORATE CRYSTALS, METHOD FOR MAKING, AND APPLICATIONS THEREOF

(75) Inventor: Joseph W Kolis, Central, SC (US)

(73) Assignee: Clemson University, Clemson, SC (US)

( * ) Notice: Subject to any disclaimer, the term of this patent is extended or adjusted under 35 U.S.C. 154(b) by 345 days.

(21) Appl. No.: 10/888,049

(22) Filed: Jul. 9, 2004

(65) Prior Publication Data
US 2005/0028724 A1 Feb. 10, 2005

Related U.S. Application Data

(60) Provisional application No. 60/486,072, filed on Jul. 10, 2003.

(51) Int. Cl.
*C01B 35/12* (2006.01)
*C30B 7/10* (2006.01)

(52) U.S. Cl. .................. 117/71; 117/944; 423/279; 428/402

(58) Field of Classification Search ............. 423/279; 117/71, 944; 428/402
See application file for complete search history.

(56) References Cited

U.S. PATENT DOCUMENTS 5,123,026 A 6/1992 Fan et al.
5,191,587 A 3/1993 Hanson et al.
5,677,921 A 10/1997 Schaffers et al.
5,684,813 A 11/1997 Keszler
5,940,418 A 8/1999 Shields
6,141,369 A 10/2000 Seelert et al.

FOREIGN PATENT DOCUMENTS

JP 62-96315 * 5/1987
JP 7-138096 * 5/1995

OTHER PUBLICATIONS

"Hydrothermally grown borate single crystals for deep ultraviolet and nonlinear optical applications", Giesber, H.G. et al, Glass Technology-Eoropean Journal of Glass Science and Technology Part A, vol. 44, No. 2, Apr. 1, 2003, pp. 42-45(4). (Abstract only).*
H.G. Giesber et al, "Hydrothermally grown borate single crystals for deep ultraviolet and nonlinear optical applications", Glass Technology, vol. 44, No. 2 (Apr. 2003), pp. 42-45.*

(Continued)

*Primary Examiner*—Wayne A. Langel
(74) *Attorney, Agent, or Firm*—Leigh P Gregory

(57) ABSTRACT

Acentric, tetragonal lithium borate crystals are disclosed along with a hydrothermal method for forming such crystals. The crystals possess unique optical, non-linear optical, and other photonic properties and may be formed of sufficient size to be useful in a wide variety of photonic devices. In addition, the disclosed crystals are very hard and can be used in specialty grinding applications such as for grinding optical components for deep UV applications.

8 Claims, 4 Drawing Sheets

OTHER PUBLICATIONS

Laudise, Robert, "hydrothermal Synthesis of Crystals," C & EN, Sep. 28, 1987, 30-43.

Nicholls, John, "Birefringent crystals find new niche in WDM netwroks," WDM Solutions, Dec. 2001, 33-36.

Marezio & Remeika, "Technical Notes," J . Phys. Chem. Solids, vol. 26, 1995, 2085-2088, no month.

Marezi & Remeika, "Polymorphism of LiMO2 Compounds and High-Pressure Single-Crystal Synthesis of LiBo2," J. of Chem. Phys., vol. 44-9, 1966, 3348-3353, no month.

Schaeffer & Hannon, "UV SOlid lasers exhibit precision and dependability," Laser Focus World, Feb. 2001, 115-134, no month.

Jones-Bay Ed., "Deep UV Applications audit improved nonlinear optics," Laser Focus World, Aug. 1998, 127-134.

* cited by examiner

ACENTRIC LITHIUM BORATE CRYSTALS, METHOD FOR MAKING, AND APPLICATIONS THEREOF

The present application claims the benefit of prior provisional U.S. Ser. No. 60/486,072, filed Jul. 10, 2003.

FIELD OF THE INVENTION

The present invention is directed to acentric, lithium borate crystals having the formula $LiBO_2$, a hydrothermal method for making the crystals, and a wide variety of end-use applications. Specifically, when made by the present hydrothermal method, single crystals of a size sufficient for use in a variety of optical applications may be formed.

BACKGROUND OF THE INVENTION

It is well established that there is a constantly evolving need for new materials for optical devices and that the demands for quality are particularly high in the case of single crystals used in optical devices.

Recently there has been an increasing demand for materials that allow for the manipulation of light in the near UV, the UV and the deep UV. This region is roughly defined as light with wavelengths between 150 nm and 350 nm.

A particular need in this region is for coherent radiation with a completely solid state source. A fully solid state laser is desirable because such are generally compact, reliable, and rugged, with low power demands. In general, all-solid-state lasers capable of direct emission of coherent radiation in the UV region are not yet readily available.

Instead, the systems currently in use are very expensive, containing complex optical components that focus and refine coherent radiation.

A potentially superior alternative is to use IR diode laser sources to excite lasing ions such as Nd:YAG which emit in the IR (e.g. 1064 nm) and then employ a non-linear optical (NLO) crystal to generate second, third or fourth harmonics to multiply the frequency of the coherent radiation.

It is the acentricity of such NLO crystals that enables them to alter coherent radiation of one or more frequencies by frequency doubling or sum frequency generation. Thus, for example, two photons of 1064 nm wavelength can be frequency doubled by an appropriate acentric crystal to form one photon of 532 nm radiation. This ability to frequency sum and divide is a very important source of new coherent radiation wavelengths. The ability to alter the frequency of coherent radiation is generally referred to as non-linear optical (NLO) behavior. The general requirements of suitable NLO crystals are that they must form in an acentric structure and should preferably exist in a uniaxial structure for phase matching purposes. They should also be large enough (typically greater than 1×2×2 mm) for polishing and orientation in devices. They should also be of high optical quality, namely containing few impurities, defects or twinning The most common inorganic crystals currently employed for NLO applications are $K(TiO)PO_4$ (commonly referred to as KTP) and $LiNbO_3$ (commonly referred to as LN). Both materials exhibit suitable NLO behavior in the visible region but their bandgaps are too narrow to exhibit satisfactory NLO behavior below 400 nm. Thus, there is a current demand for materials that have very wide bandgaps but display NLO behavior so they are suitable for use in the UV region as defined above. This is particularly the case for the next generation of ultra high-resolution photolithography. In this field it is anticipated that there will be demands for a wide variety of optical components capable of manipulating photons in the region between 120 nm and 200 nm. The list of demands for suitable UV NLO materials is well known. The crystals must be in an acentric space group for harmonic generation, have bandgaps wider than 200 nm (between 120 and 200 nm), good thermal stability and a very high optical damage threshold. Finally, they must be able to be grown as optical quality single crystals greater than several millimeters in size.

The primary class of compounds exhibiting this behavior is the metal borates. Borates generally have wide bandgaps (175-300 nm), high optical damage thresholds, and show a marked tendency to crystallize in acentric space groups. Thus, they are excellent materials for non-linear optical applications involving lasers with wavelengths below about 300 nm. Specifically, borates have recently received attention as potential NLO materials in the near UV, UV and deep UV. Several borate materials have recently been employed in commercial applications in UV optical devices. These include beta barium borate ($\beta$-$BaB_2O_4$, commonly referred to as BBO), $LiB_3O_5$ (commonly referred to as LBO) and $CsLiB_6O_{10}$ (commonly referred to as CLBO). Several other borates have also been proposed as potential UV NLO materials including $Sr_2Be_2B_2O_7$ (commonly referred to as SBBO) and $YCaOBO_3$ (commonly referred to as YCOB). The primary limitation for full-scale employment of borate materials is based on the ability to grow high quality crystals of sufficient size for use in a device containing a coherent light beam. Borates often either decompose when they melt or, instead, tend to form highly viscous melts. These factors inhibit growth of good quality single crystals. The primary methods of growth are typically flux or stop seeded solution techniques requiring very high temperature. However, it is often difficult or impossible to grow large borate crystals of sufficient optical quality by either method.

Very small microcrystallites of tetragonal lithium borate of the formula $LiBO_2$ with a uniaxial acentric structure have been formed by the simultaneous application of extremely high temperatures and pressures. These microcrystallites were incapable of scaleup to useful products, as they have dimensions of less than 1 mm on any side. Accordingly, this technologically demanding method prevents any foreseeable route to crystals of useful size or quantity.

Hydrothermal techniques are an excellent route to high quality single crystals for electro-optic applications. For example, all electronic grade quartz is grown commercially by the hydrothermal method. Further, KTP is grown by both flux and hydrothermal methods, and it is widely acknowledged by those familiar with the art that the hydrothermally grown product is generally of superior quality. The hydrothermal method involves the use of superheated water (liquid water heated above its boiling point) under pressure to cause transport of soluble species from a nutrient rich zone to a supersaturated growth zone. Generally, a seed crystal is placed in the growth zone to serve as a deposition site for growth, and supersaturation is achieved by the use of differential temperature gradients. The superheated fluid is generally contained under pressure, typically 5-30 kpsi, in a metal autoclave. Depending on the chemical demands of the system the autoclave can be lined with a noble metal using either a fixed or floating liner. These general techniques are well known to those of ordinary skill in the art and have been used for the growth of other electro-optic crystals, such as KTP and quartz.

Another need in deep UV optical component applications is for new grit material for grinding optical windows, mirrors, prisms and other optical components. Photonic applications in the deep UV, particularly, but not limited to 157 nm photolithography, require high quality material with bandgaps wider than 157 nm. The current materials of choice in these applications are $CaF_2$ and $MgF_2$. Both have very wide bandgaps but are somewhat soft and require extensive polishing for suitable use in photonic applications. The choice of polishing grit is particularly important because the softness of the fluorides invariably causes small amounts of grit to become embedded in the material resulting in imperfections in, for example, a finished photolithography map. Thus, it is important to use a very hard material with a bandgap greater than the wavelength in use. Finding a suitable grit for grinding wide bandgap optical components is difficult because few hard material such as nitrides, carbides, borides or metal oxides have a sufficiently wide bandgaps, while metal halides are rarely of sufficient hardness to serve as grit.

SUMMARY OF THE INVENTION

The tetragonal $LiBO_2$ of the present invention fulfills the above-described requirements as it has a very wide band gap of 140 nm (one of the widest bandgaps of any known oxide material) and is much harder than almost any metal halides. The hydrothermal technique disclosed herein is a simple, economic route to a hard material with a very wide bandgap.

Accordingly, it has been found in accordance with the present invention that acentric, tetragonal lithium borate may be grown as optical-quality single crystals for a variety of applications. Specifically, the present invention is directed to the hydrothermal synthesis and crystal growth of acentric, tetragonal lithium borate with considerable potential for near UV, UV and deep UV optical applications.

Specifically, the present invention is directed to a hydrothermal synthesis of single crystals of acentric, tetragonal $LiBO_2$. The acentricity is significant because the compounds can function in NLO applications as described above. The uniaxial nature of the present material means that it can phase match and act as a birefringent.

Thus, in one aspect the present invention is directed to an acentric, tetragonal lithium borate crystal comprising the formula $LiBO_2$, having a dimension of at least 2 mm in at least one direction.

The present invention is also directed to a method for growing a tetrahedral lithium borate crystal which includes the step of reacting $B_2O_3$ and LiOH in an aqueous solution at a temperature of from about 350° C. to about 600° C. and at a pressure of from about 5 kpsi to about 45 kpsi, the aqueous solution comprising a hydroxide ion concentration of from about 1 to about 5 molar.

BRIEF DESCRIPTION OF THE FIGURES OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

DETAILED DESCRIPTION OF THE PREFERRED EMBODIMENTS

Figure 1:
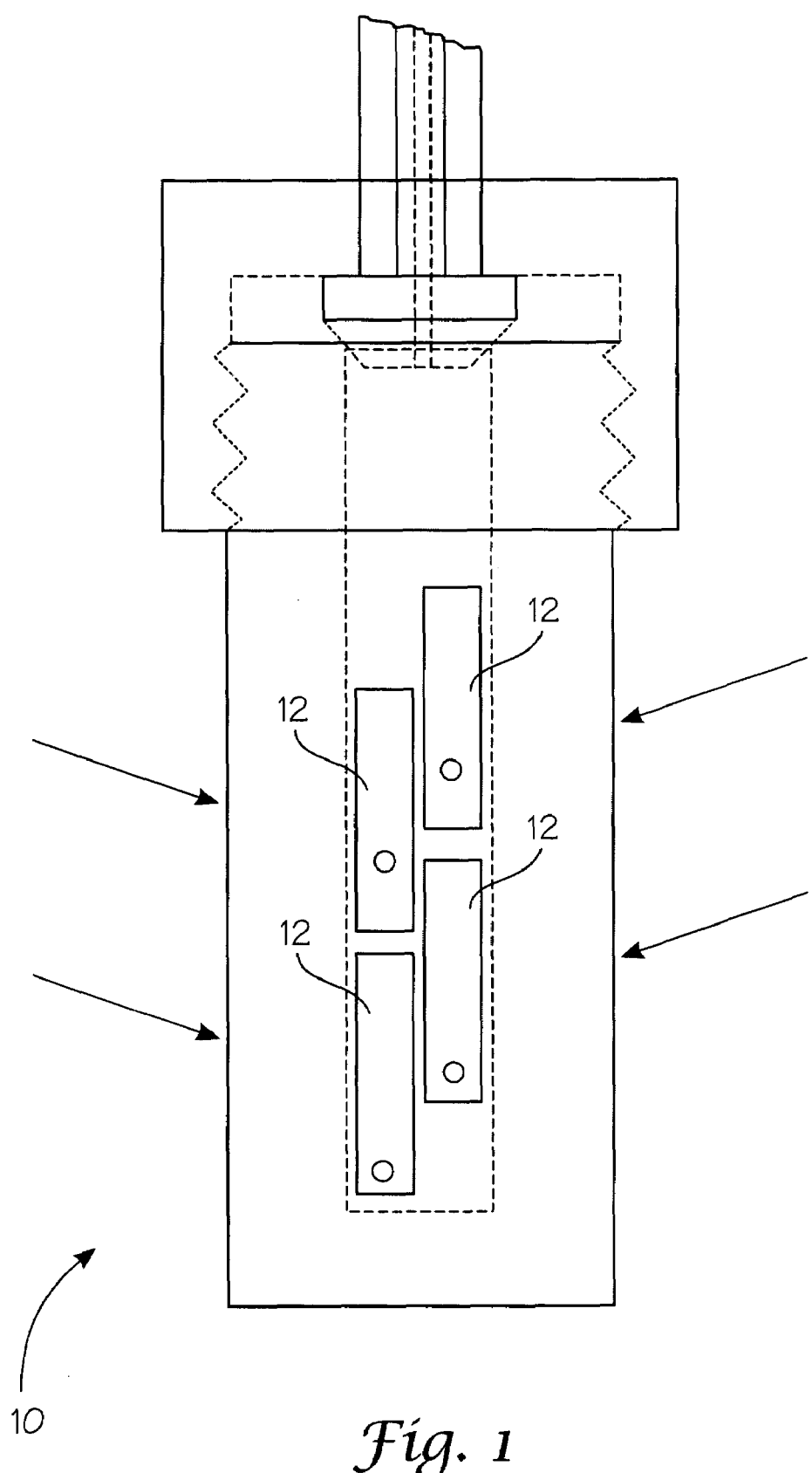
FIG. 1 schematically illustrates an autoclave loaded for crystal growth under hydrothermal conditions.

The present invention is directed to a novel and useful method for making single crystals of acentric, tetragonal lithium borate crystals with the formula $LiBO_2$. Specifically, the present invention is directed to a hydrothermal method for growing $LiBO_2$ crystals and the crystals made by this method. Additionally, the present invention is directed to single crystals of $LiBO_2$, which are sufficiently large for use in a variety of optical applications.

Compounds with the formula $LiBO_2$ occur in either the common orthorhombic structure, or the extremely rare tetragonal structure. The readily available orthorhombic structure is centric and thus of no use in NLO applications. Heretofore, tetragonal $LiBO_2$ has only been prepared by a complex high-pressure technique completely unsuitable for production of anything but minute quantities of microcrystallites. The present invention provides a method for growing large quantities of single, tetragonal crystals of $LiBO_2$ and allows for controlled crystal growth and scaleup. The structure of the present tetragonal crystals is uniaxial and acentric. As such, they are suitable for a variety of non-linear optical applications. In particular, the tetragonal material has a very wide bandgap (142 nm) allowing it to be used for a number of deep-UV applications such as frequency doubling, optical parametric oscillation, and windows. The material is also very hard so it can be used a grit in grinding applications, such as, for example, grinding $CaF_2$ optical components.

Since the present crystal is acentric, it may be used in non-linear optical applications and devices. These applications include but are not limited to frequency doubling, tripling and quadrupling, sum frequency generation, optical parametric oscillation and amplification and any other desirable non-linear behavior. The present crystals also have a uniaxial structure, providing them with the ability to phase match for coherent radiation emission.

Generally, the inherent bandgap of any NLO crystal should be substantially greater than the energy of coherent radiation being emitted. Thus a NLO crystal that frequency doubles 1064 nm to 532 nm radiation must have a bandgap substantially larger than that of 532 nm radiation or all of the photons being produced will simultaneously get absorbed. This limitation is significant for the most common commercial materials, $LiNbO_3$ and KTP, as those materials possess bandgaps which are not much larger than 3.2 eV. For near UV, UV and deep UV applications bandgaps are required to be much larger, typically greater than 5 eV. This limitation led to the development of new acentric borates, BBO and LBO, discussed in the Background section above, which each have bandgaps greater than 5 eV. The bandgaps of the crystals of the present invention are particularly wide, greater than 8.0 eV. Thus, the present crystals may be employed in applications for which other electro-optical materials are not suitable. These include, but are not limited to visible, UV, and deep UV NLO applications. Specifically, the present crystals can frequency-double coherent radiation to yield blue, violet, UV and deep UV laser emission.

Further, the present invention is directed to an optical parametric oscillator, which contains a $LiBO_2$ crystal as defined herein.

Additionally, the ability to grow uniaxial, acentric single $LiBO_2$ crystals of high optical quality, wide bandgap and desirable physical characteristics leads to suitability for other end-use applications. Specifically, the uniaxial nature of the structure allows for use in applications including birefringence, double refraction, prisms and retarders. In addition, the crystals can be used as windows and lenses in UV and deep UV applications.

Specifically, crystals in accordance with the present invention demonstrate electro-optic properties, including piezoelectric and acousto-optic responses. Thus, the present crystals may be employed in the development of devices, which act as electro-optic or acousto-optic modulators, switches and detectors.

Further, the crystals in accordance with the present invention are very hard. The hardness of these materials also allows for their application in precision grinding and polishing applications and as abrasive materials.

In yet another aspect the present invention is directed to a hydrothermal method for growing acentric, tetragonal $LiBO_2$ crystals. Specifically, the present invention is directed to the production of $LiBO_2$ powder, microcrystals and large single crystals in the tetragonal-42m point group. Using the hydrothermal method described herein, the material can be prepared in two forms, either as large, high quality single crystals suitable for use in optoelectronic applications (after suitable cutting polishing and coating), or as microcrystalline powder particulates that can be separated by size, suitable for use as polishing grit. Both forms can be prepared by hydrothermal growth under the conditions described herein. The hydrothermal method as described herein can also be used to scale the procedure up to form large amounts of the tetragonal material in either the form of microcrystalline powder or as large single crystals.

By a first method in accordance with the present invention, water containing lithium hydroxide sufficient to create an $OH^-$ concentration of from about 1 to about 5 molar is heated to temperatures of from about 350° C. to about 600° C. at pressures between 5 and 45 kpsi in the presence of $B_2O_3$ starting material. The $B_2O_3$ and LiOH are present in a 1:2 molar ratio. The present growth reactions are performed in sealed ampoules of noble metal, either silver, gold or platinum. The sealed ampoules are inside a metal autoclaves capable of withstanding the high temperatures and pressures of the reaction as described above.

FIG. 1 schematically represents a preferred autoclave 10 employed in achieving the temperature and pressure conditions necessary for the present reaction. The reactants are added to a silver tube 12 having a diameter of 0.25 in and a length of 2 in. Then, the hydroxide source is added to the tube and it is welded shut. The sealed tube or ampoule is placed in the autoclave which has an internal diameter of ½ in and a depth of 6 in. Water is added to the autoclave, filling approximately 75% of the remaining free volume of the autoclave. The autoclave is sealed shut using a cold seal. The sealed autoclave containing the sealed silver ampoule is placed in a tube furnace oriented in a vertical position. The furnace is heated to the desired elevated temperature and held at that temperature for an extended period of time. The water in the autoclave expands at this elevated temperature to create the desired elevated pressure. Thereafter, the autoclave is removed from the oven and cooled in a stream of air.

In a second growth method in accordance with the present invention reaction conditions similar to those described above are used to dissolve, transport and grow crystals of $LiBO_2$ starting from a suitable feedstock of orthorhombic $LiBO_2$ powder. Typically $LiBO_2$ powder is placed in an autoclave with the appropriate mineralizer as described above. Then the powdered orthorhombic $LiBO_2$ starting material is converted to large single crystals of tetragonal $LiBO_2$.

In yet another method in accordance with the present invention, single crystals of tetragonal $LiBO_2$ of a size larger than one centimeter in one direction can be grown using a hydrothermal transport method using either orthorhombic or tetrahedral $LiBO_2$ as a feedstock. By this third inventive method $LiBO_2$ powder and a solution of LiOH such that the concentration of $OH-$ is between about $1\times10^{-6}$ and 5 molar is placed in an autoclave that has a noble metal liner. The autoclave is heated to temperatures between 350 and 600° C. at pressures between 5 kpsi and 45 kpsi. A thermal gradient of between 25 and 100° C. is established between a hot feedstock zone and the cooler growth zone (see FIG. 4). The gradient is maintained by the use of a noble metal baffle. In addition single crystals of tetragonal $LiBO_2$ are suspended in the cool zone to act as growth seeds. Feedstock is transported through the hydrothermal fluid to the growth zone where it deposits on the seeds as new tetragonal $LiBO_2$ single crystals. After sufficient growth of new tetragonal $LiBO_2$ crystals occurs on the seeds, the single crystals are harvested.

Figure 4:
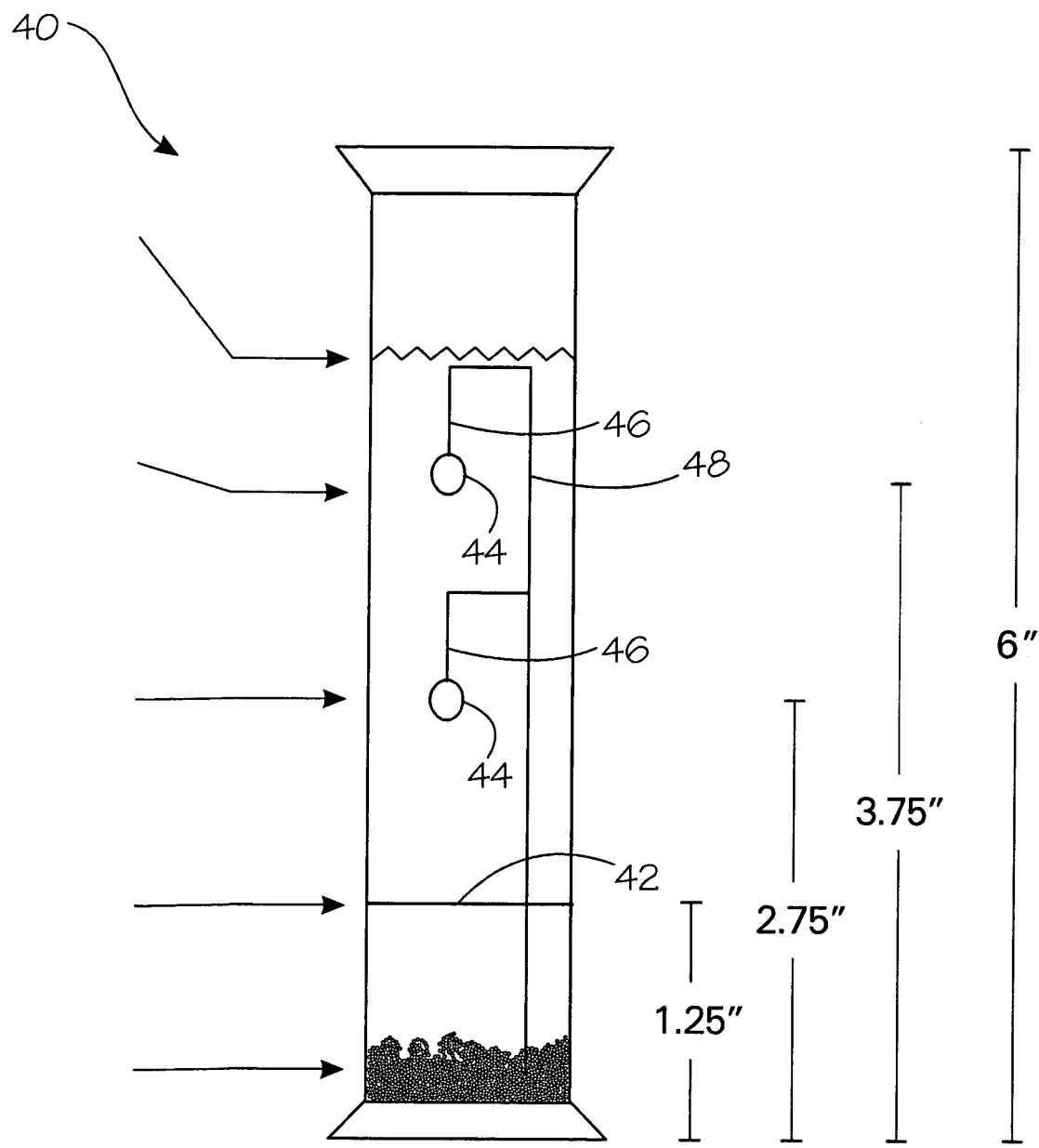
FIG. 4 schematically illustrates a silver tube with seed crystals suspended from a ladder for the growth of larger crystals in accordance with the present invention by a transport growth technique.

Specifically, the apparatus for performing the hydrothermal growth transport method is shown in FIG. 4 which shows silver tube 40, preferably of dimensions ⅜ in by 6 in. A silver baffle 42 with three small holes in it is placed 1.25 in above the bottom of the tube. Two single crystals 44 of $LiBO_2$ prepared in accordance with the present invention, each approximately 2×2×4 mm, serve as seeds. Holes are drilled in the crystals and they are hung by silver thread 46 on a small silver ladder 48 placed within the tube. The two seed crystals are hung 2.75 in and 3.75 in above the bottom of the tube, respectively. Preferably, the aqueous hydroxide is added to the tube and fills about 80% of the remaining volume of the tube. The tube is welded shut and placed in an autoclave with a cold seal and a ½ in by 8 in opening. An amount of water sufficient to occupy 80% of the remaining free volume is added and the autoclave sealed and placed in an upright tube furnace. The autoclave is heated with a temperature gradient. After an extended period of time, the autoclave is cooled, opened and the silver tube opened.

This method allows for the controlled growth of large single crystals suitable for cutting into numerous pieces for polishing, coating and aligning in laser and other optoelectronic devices. These crystals can be used in various optical applications, including but not limited to, harmonic generation, phase matching and optical parametric oscillation. In addition, the crystals can be used as windows for deep UV applications, including, but not limited to 157 nm photolithography.

Figure 2:
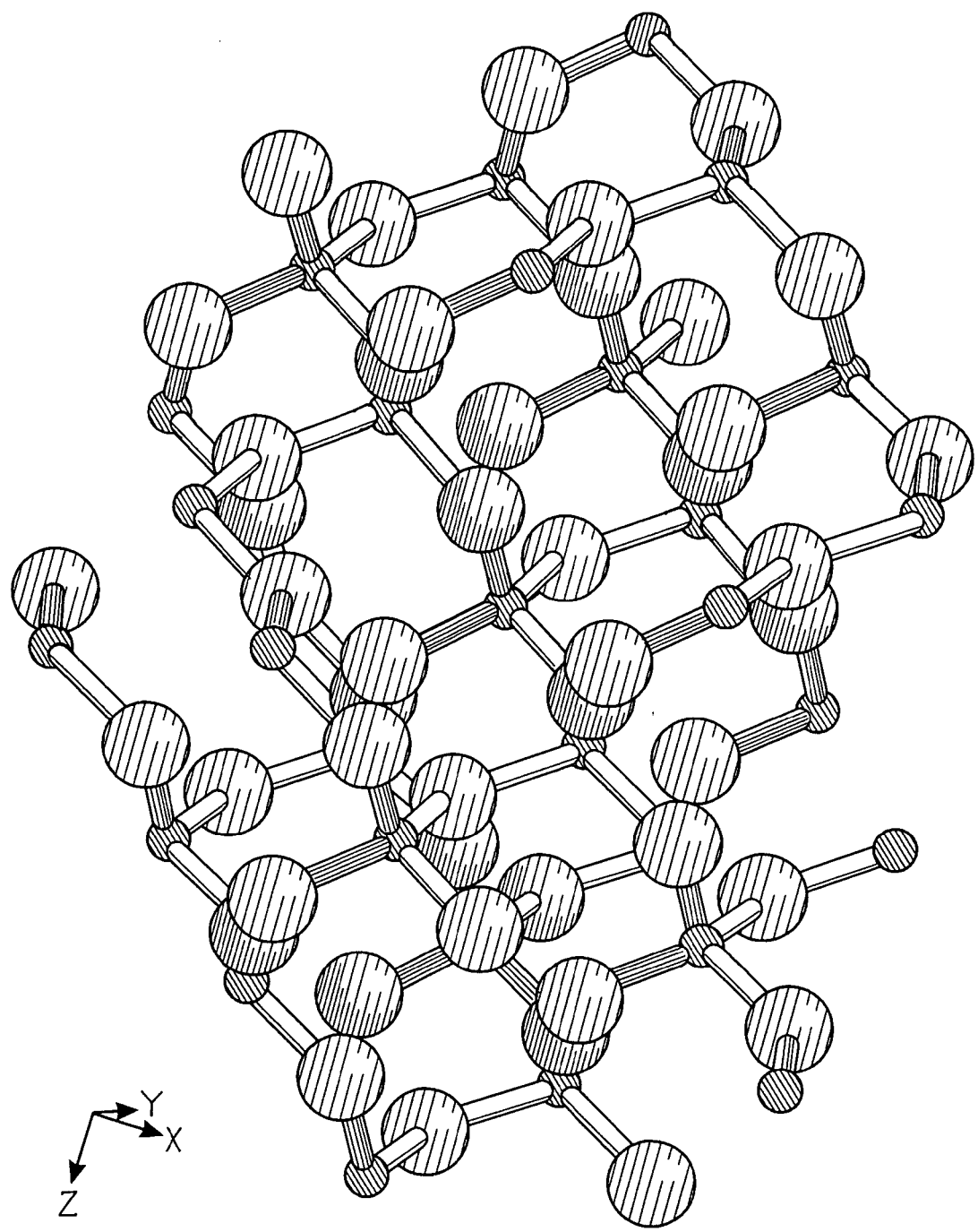
FIG. 2 is a computer-generated representation of the tetragonal structure of $LiBO_2$ in accordance with the present invention obtained by single crystal X-ray diffraction.

The general structure of the present crystals is illustrated in FIG. 2, which is a computer generated representation of the structure obtained by crystal X-ray diffraction, wherein the the lithium ions 20 are arranged through the borate groups 22.

The following Examples are presented in order to clarify, and not restrict, the present invention.

EXAMPLE 1

Tetragonal $LiBO_2$ was synthesized by combining $B_2O_3$, and 5.3M LiOH in a molar ratio of 1:2, respectively. The reactants were loaded into a silver ampoule (1.2 cm³ volume) containing 0.4 ml of the aqueous base solution and then the ampoule was welded shut. The ampoules were placed into a 27 ml Tuttle seal autoclave and water was pumped into the vessel so that, at 600° C., a pressure of 2 kbar was obtained in order to prevent the silver tubes from rupturing. The autoclave was placed in a tube furnace and held at 600° C. for 3 days and then cooled to room temperature under continuous air flow. The ampoules were placed in liquid nitrogen to freeze the contents and the ends of the ampoules were removed and squeezed open so that the products could be flushed out onto a suction funnel apparatus using distilled water. Using this technique, single crystals of tetragonal $LiBO_2$ were grown via spontaneous nucleation to sizes up to 5.5×5.5×5.5 mm³.

Figure 3:
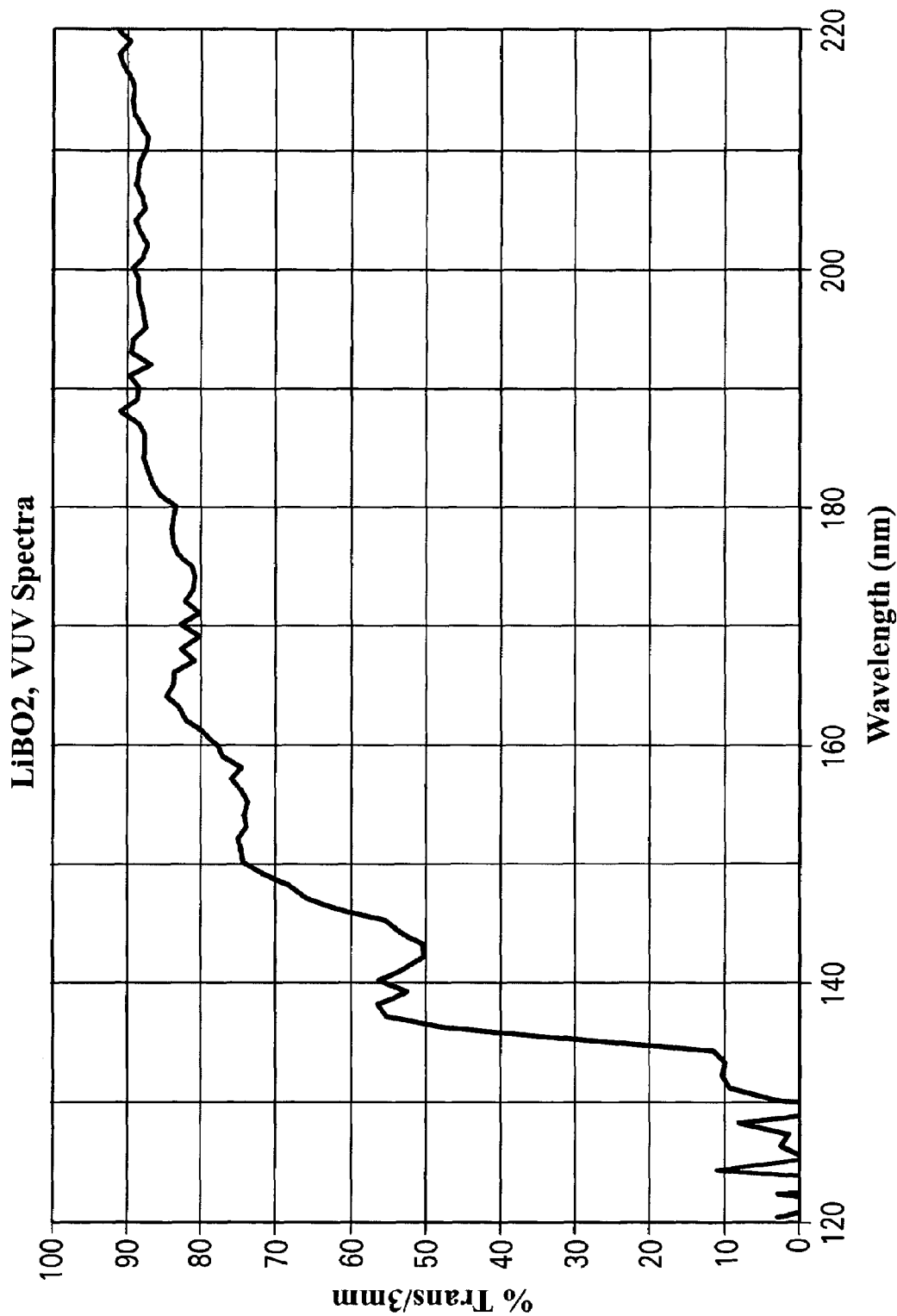
FIG. 3 is an absorption spectrum of a single crystal of $LiBO_2$ made in accordance with the present invention showing a bandgap of nearly 140 nm.

The structure of microcrystalline powder prepared in accordance with this Example was confirmed by powder X-ray diffraction. The powder pattern obtained for this powdered material is identical that reported previously. Electronic spectroscopy revealed a bandgap of 140 nm, as is seen in FIG. 3.

EXAMPLE 2

Large single crystal seeds of tetragonal $LiBO_2$ were grown by the present inventive hydrothermal transport reaction from $LiBO_2$ powder as feedstock via spontaneous nucleation as described above and as shown by the following reaction.

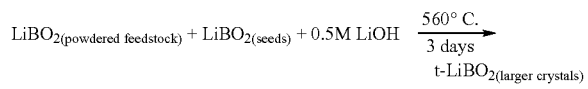

Small seeds grown by the method of Example 1 were hung from silver wire after being drilled and weighed, and the ladder was inserted into a 0.375" OD 6" long silver tube, which was placed in an autoclave. The apparatus was designed to maintain the feedstock at about 580° C. and the seed crystals at least 50° C. cooler. Two crystals were selected based on size and quality. They were drilled using a 0.5 mm diamond coated grinding pin locked in a mini drill press apparatus. Next they were weighed separately, as were two 2.54 cm pieces of 0.1 mm diameter silver wire on a microbalance. A ladder was constructed of silver wire (1 mm diameter) and using the 0.1 mm diameter silver wire the crystals were attached to the ladder. After measuring the positions of the hanging crystals the ladder was inserted into a 0.375" OD 6" long silver tube that had 1.0 g of ground orthorhombic $LiBO_2$ in the bottom to serve as the feedstock or nutrient. Finally 6 ml of $1 \times 10^{-6}$ M LiOH was added and the ampoule was welded shut and placed in the 27 ml Tuttle seal autoclave and three thermocouples were placed so one would be at the feedstock and the other two would be at the crystals. The reaction ran for 3 days. The ampoule was opened and the crystals were removed from the ladder and weighed again. It was found that the crystal on the top rung had a final weight of 171.777 mg which meant a weight gain of 84.325 mg. The crystal initially weighed 65.144 mg meaning that in three days the crystal had a 129.4% mass gain.

A crystal grown in accordance with this Example was confirmed as the tetragonal structural type using single crystal X-ray diffraction. A single crystal was mounted on a Rigaku AFC diffractometer with a Mercury CDD detector. Of the 489 observed reflections 61 were unique and solution was found using the SHELX direct methods program. Least squares refinement was performed to $R(F_o^2)=0.039$. The space group was confirmed to be tetragonal I-42d with a=b=4.1987(6)Å, c=6.524(1)Å, $\alpha=\beta=\gamma=90°$, essentially identical to, but of much higher precision and accuracy than, that reported previously.

A ground sample of crystal grown in accordance with the present Example exhibited an X-ray diffraction pattern identical to the microcrystalline powder of Example 1. Also, as with the microcrystallites of Example 1, the crystals grown in accordance with this Example exhibited a bandgap of 140 nm.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims. Moreover, Applicants hereby disclose all subranges of all ranges disclosed herein. These subranges are also useful in carrying out the present invention.

I claim:

1. A method for growing a tetrahedral lithium borate crystal comprising:
    reacting $B_2O_3$ and LiOH in an aqueous solution at a temperature of from about 350° C. to about 600° C. and at a pressure of from about 5 kpsi to about 45 kpsi, the aqueous solution comprising a hydroxide ion concentration of from about $1 \times 10^{-6}$ to about 5 molar.

2. A method for growing a tetrahedral lithium borate crystal comprising:
    reacting an $LiBO_2$ feedstock powder and LiOH in an aqueous solution at a temperature of from about 350° C. to about 600° C. and at a pressure of from about 5 kpsi to about 45 kpsi, the aqueous solution comprising a hydroxide ion concentration of from about $1 \times 10^{-6}$ to about 1 molar.

3. The method set forth in claim 2 wherein the $LiBO_2$ feedstock powder comprises tetragonal $LiBO_2$.

4. The method set forth in claim 2 wherein the $LiBO_2$ feedstock powder comprises orthorhombic $LiBO_2$.

5. An acentric, tetragonal lithium borate crystal comprising the formula $LiBO_2$, having a dimension of at least 2 mm in at least one direction.

6. The lithium borate crystal set forth in claim 5 wherein the crystal belongs to the tetragonal I-42d space group.

7. The lithium borate crystal set forth in claim 6 wherein the crystal belongs to the tetragonal 42m point group.

8. The lithium borate crystal set forth in claim 5 wherein the crystal exhibits non-linear optical properties.

* * * * *

UNITED STATES PATENT AND TRADEMARK OFFICE
CERTIFICATE OF CORRECTION

PATENT NO. : 7,374,616 B2
APPLICATION NO. : 10/888049
DATED : May 20, 2008
INVENTOR(S) : Joseph W. Kolls Page 1 of 1

It is certified that error appears in the above-identified patent and that said Letters Patent is hereby corrected as shown below:

Column 1, line 8 (insert prior to FIELD OF INVENTION) --This invention was made with government support under grant number 9714408 awarded by the National Science Foundation. The government has certain rights in the invention.--

Signed and Sealed this
Twenty-sixth Day of February, 2013

Teresa Stanek Rea
*Acting Director of the United States Patent and Trademark Office*